(12) United States Patent
Kim et al.

(10) Patent No.: US 9,564,311 B2
(45) Date of Patent: Feb. 7, 2017

(54) METHOD OF DEPOSITING THIN FILM (71) Applicant: ASM IP Holding B.V., Almere (NL)

(72) Inventors: Young Hoon Kim, Cheonan-si (KR); Dae Youn Kim, Daejeon (KR); Sang Wook Lee, Gunpo-si (KR)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/526,811

(22) Filed: Oct. 29, 2014

(65) Prior Publication Data

US 2015/0125629 A1  May 7, 2015

(30) Foreign Application Priority Data

Nov. 7, 2013 (KR) .......................... 10-2013-0135036

(51) Int. Cl.
| | |
|---|---|
| H01L 21/02 | (2006.01) |
| C23C 16/30 | (2006.01) |
| C23C 16/40 | (2006.01) |
| C23C 16/452 | (2006.01) |
| C23C 16/455 | (2006.01) |

(52) U.S. Cl.
CPC ....... *H01L 21/02274* (2013.01); *C23C 16/402* (2013.01); *C23C 16/452* (2013.01); *C23C 16/45542* (2013.01); *H01L 21/02164* (2013.01)

(58) Field of Classification Search
None
See application file for complete search history.

(56) References Cited

U.S. PATENT DOCUMENTS

| | | | |
|---|---|---|---|
| 2005/0019494 A1* | 1/2005 | Moghadam | C23C 16/402 427/255.32 |
| 2005/0042373 A1* | 2/2005 | Kraus | C23C 16/45542 427/248.1 |
| 2008/0020593 A1* | 1/2008 | Wang | C23C 16/401 438/782 |

\* cited by examiner

*Primary Examiner* — Joseph Miller, Jr.
(74) *Attorney, Agent, or Firm* — Lex IP Meister, PLLC (57) ABSTRACT

A method of depositing a thin film includes: repeating a first gas supply cycle a first plurality of times, the first gas supply cycle including supplying a source gas to a reaction space; supplying first plasma while supplying a reactant gas to the reaction space; repeating a second gas supply cycle a second plurality of times, the second gas supply cycle including supplying the source gas to the reaction space; and supplying second plasma while supplying the reactant gas to the reaction space, wherein the supplying of the first plasma includes supplying remote plasma, and the supplying of the second plasma includes supplying direct plasma.

15 Claims, 10 Drawing Sheets

METHOD OF DEPOSITING THIN FILM

CROSS-REFERENCE TO RELATED APPLICATION

This application claims priority to and the benefit of Korean Patent Application No. 10-2013-0135036 filed in the Korean Intellectual Property Office on Nov. 7, 2013, the entire contents of which are incorporated herein by reference.

BACKGROUND OF THE INVENTION (a) Field of the Invention

The present invention relates to a method of depositing a thin film.

(b) Description of the Related Art

As a circuit line width of a semiconductor device is reduced, the device is prone to failure due to heat occurring during a semiconductor process such as deposition of a film at high temperature. In order to solve problems caused by such heat, a low temperature process using plasma was suggested.

A semiconductor manufacturing process using plasma includes a thin film deposition process and an ashing process. Such a plasma process is classified into an in situ plasma process or a direct plasma process of directly generating plasma within a reaction space on a substrate in which a semiconductor process is performed and a remote plasma process of generating plasma outside of the reaction space and inducing the plasma to the reaction space.

In the in situ plasma process, plasma may be efficiently supplied, but in the in situ plasma process, when oxygen radical is used as a reactant gas, sub-layer oxidation, in which a sub-layer of layers that are deposited in the substrate is unnecessarily oxidized, may occur and thus, device characteristics may be deteriorated.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method of depositing a thin film having advantages of enhancing efficiency of a plasma process, depositing a thin film having a desired characteristics, and preventing sub-layer oxidation during the plasma process.

An exemplary embodiment of the present invention provides a method of depositing a thin film, the method including: repeating a first gas supply cycle including supplying a source gas to a reaction space a first plurality of times; supplying first plasma while supplying a reactant gas to the reaction space; and repeating a second gas supply cycle including supplying the source gas to the reaction space a second plurality of times; supplying second plasma while supplying the reactant gas to the reaction space, wherein the supplying of first plasma includes supplying remote plasma, and the supplying of second plasma includes supplying direct plasma.

The repeating the first gas supply cycle for the first plurality of times may include repeating the first gas supply cycle about ten times. The first gas supply cycle may include: supplying the source gas together with a purge gas to the reaction space for a first time; supplying the purge gas to the reaction space for a second time; and supplying the first plasma while supplying the reactant gas together with the purge gas to the reaction space for a third time. The first gas supply cycle may further include supplying the purge gas to the reaction space for a fourth time.

The second gas supply cycle may include: supplying the source gas together with a purge gas to the reaction space for a fifth time; supplying the purge gas to the reaction space for a sixth time; and supplying the second plasma while supplying the reactant gas together with the purge gas to the reaction space for a seventh time. The second gas supply cycle may further include supplying the purge gas to the reaction space for an eighth time.

The first gas supply cycle may also include: supplying the reactant gas together with a purge gas to the reaction space for a first time, a second time, a third time, and a fourth time; supplying the source gas for the first time; and supplying the first plasma for the third time.

The second gas supply cycle may also include: supplying the reactant gas together with a purge gas to the reaction space for a fifth time, a sixth time, a seventh time, and an eighth time; supplying the source gas for the fifth time; and supplying the second plasma for the seventh time.

The source gas may include silicon. For example, the source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$.

The reactant gas may include an oxygen gas. For example, the reactant gas may include at least one of $O_2$, $O_3$, $NO_2$, and $CO_2$.

In accordance with a method of depositing a thin film according to an exemplary embodiment of the present invention, efficiency of a plasma process can be enhanced, a thin film having a desired characteristic can be deposited, and sub-layer oxidation can be prevented during the plasma process.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may have been exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a method of depositing a thin film according to an exemplary embodiment of the present invention will be described with reference to the drawings.

Figure 1:
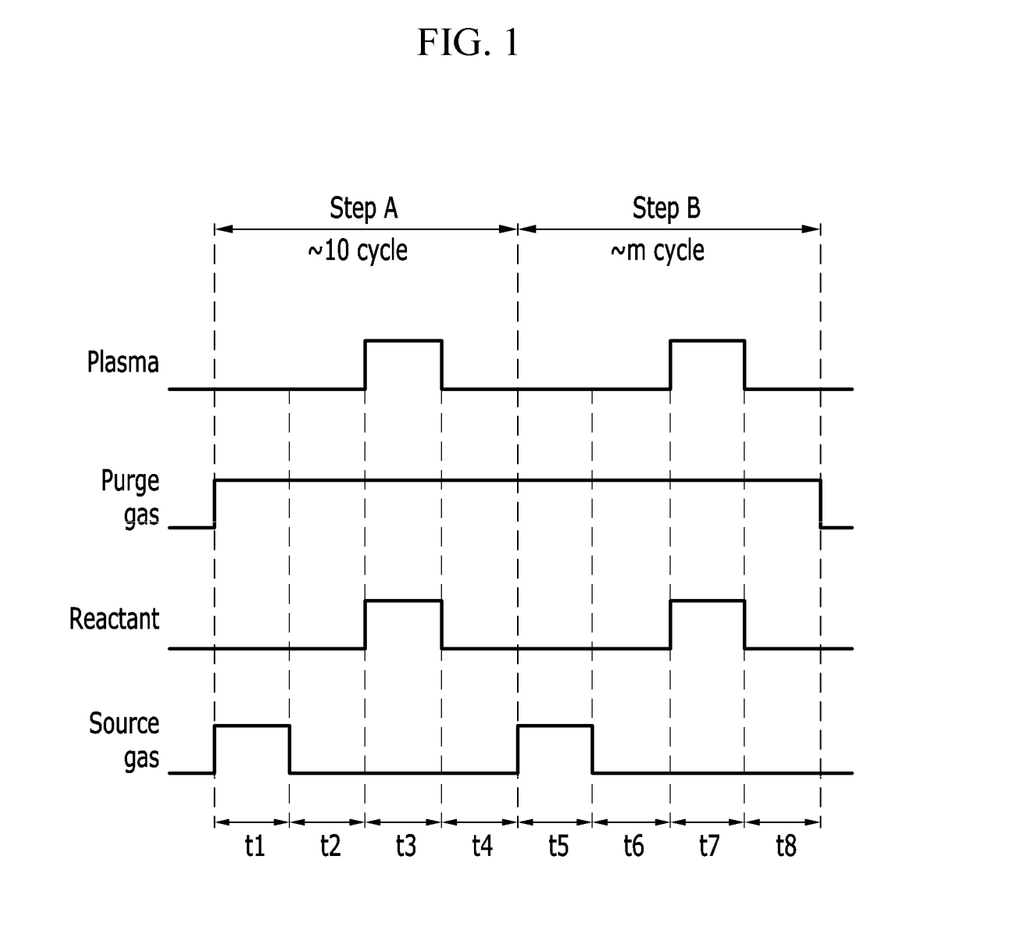
FIG. 1 is a diagram illustrating a gas supply cycle of a method of depositing a thin film according to an exemplary embodiment of the present invention.

A method of depositing a thin film according to an exemplary embodiment of the present invention will be described with reference to FIG. 1. FIG. 1 is a diagram illustrating a gas supply cycle of a method of depositing a thin film according to an exemplary embodiment of the present invention.

Referring to FIG. 1, a method of depositing a thin film includes a first gas supply cycle (Step A) and a second gas supply cycle (Step B). In the first gas supply cycle (Step A), from first time t1 to fourth time t4, while a purge gas is supplied, a source gas is supplied for first time t1, and while a reactant gas is supplied for third time t3, first plasma is supplied.

The source gas that is supplied to a reaction space for first time t1 is adsorbed on a substrate, and the reactant gas that is supplied to the reaction space for third time t3 is activated by first plasma to react with the source gas that is adsorbed on the substrate, thereby forming a thin film. In this case, a process of supplying first plasma is a remote plasma process.

In the second gas supply cycle (Step B), from fifth time t5 to eighth time t8, while a purge gas is supplied, a source gas is supplied for fifth time t5, and while a reactant gas is supplied for seventh time t7, second plasma is supplied.

The source gas that is supplied to the reaction space for fifth time t5 is adsorbed on the substrate, and the reactant gas that is supplied to the reaction space for seventh time t7 is reactivated by second plasma to react with the source gas that is adsorbed on the substrate, thereby forming a thin film. In this case, a process of supplying second plasma is an in situ plasma process or a direct plasma process.

After the first gas supply cycle (Step A) is initially repeated about ten times, the second gas supply cycle (Step B) is repeated a plurality of times such that a thin film of a desired thickness is deposited.

Here, a silicon source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$. A gas containing oxygen, which is a reactant gas, may include at least one of $O_2$, $O_3$, $NO_2$, and $CO_2$.

In the foregoing exemplary embodiment, from first time t1 to fourth time t4 and from fifth time t5 to eighth time t8, an inert purge gas is continuously supplied, but in accordance with a method of depositing a thin film according to another exemplary embodiment of the present invention, a reactant gas is activated only for third time t3 and seventh time t7 in which plasma is supplied without supply of an additional inert purge gas, and the reactant gas is not activated for other time cycles to perform a function of a purge gas.

In this way, in accordance with a method of depositing a thin film according to an exemplary embodiment of the present invention, at initial thin film deposition step, after a thin film is deposited using a remote plasma process, a thin film is deposited using a direct plasma process such as an in situ plasma process. Because motility of oxygen radical occurring by remote plasma is lower than that of oxygen radical occurring by in situ plasma, at initial thin film deposition step, relatively less sub-layer oxidation occurs. Therefore, deterioration of device characteristics according to sub-layer oxidation can be minimized.

Further, at the initial step, after a remote plasma process is used, by depositing a thin film using an in situ plasma process, a thin film of a desired thickness can be deposited at a fast speed.

Figure 2:
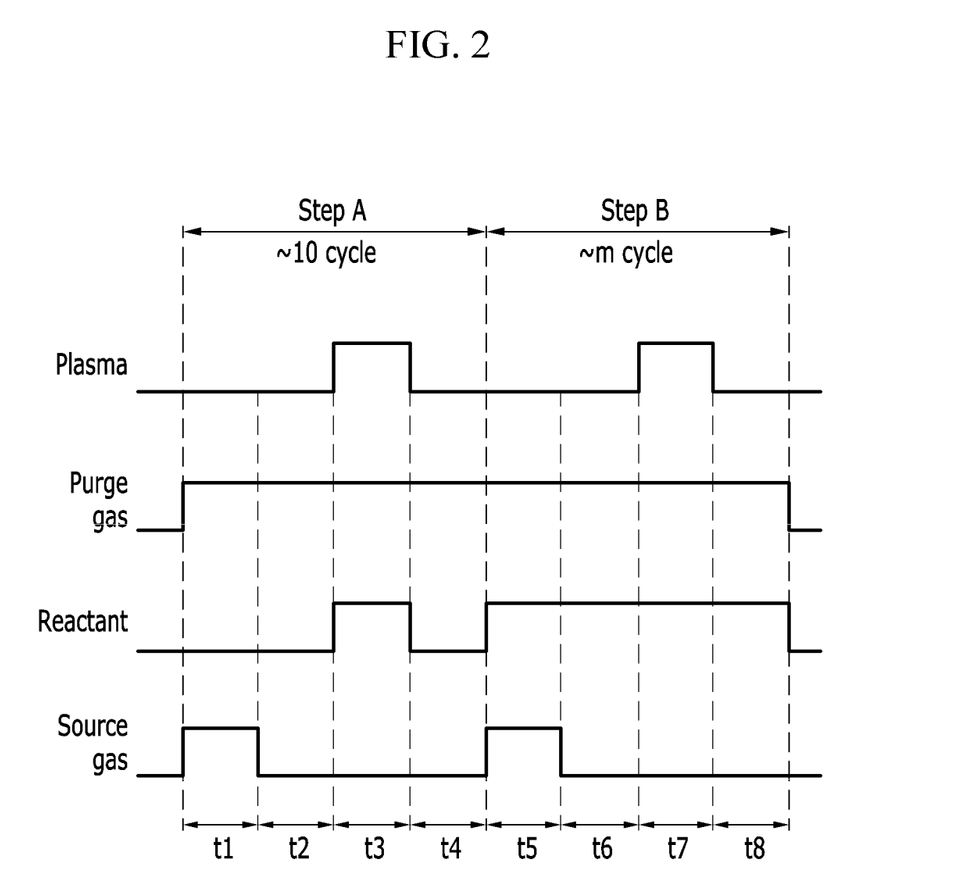
FIG. 2 is a diagram illustrating a gas supply cycle of a method of depositing a thin film according to another exemplary embodiment of the present invention.

Hereinafter, a method of depositing a thin film according to another exemplary embodiment of the present invention will be described with reference to FIG. 2. FIG. 2 is a diagram illustrating a gas supply cycle of a method of depositing a thin film according to another exemplary embodiment of the present invention.

Referring to FIG. 2, a method of depositing a thin film includes a first gas supply cycle (Step A) and a second gas supply cycle (Step B). In the first gas supply cycle (Step A), from first time t1 to fourth time t4, while a purge gas is supplied, a source gas is supplied for first time t1, and while a reactant gas is supplied for third time t3, first plasma is supplied.

The source gas that is supplied to a reaction space for first time t1 is adsorbed on a substrate, and the reactant gas that is supplied to the reaction space for third time t3 is activated by first plasma to react with a source gas that is adsorbed on the substrate, thereby forming a thin film. In this case, a process of supplying first plasma is a remote plasma process.

In the second gas supply cycle (Step B), from fifth time t5 to eighth time t8, while a purge gas and a reactant gas are supplied, a source gas is supplied for fifth time t5, and second plasma is supplied for seventh time t7. When the source gas and the reactant gas have weak reactivity in a non-activation state, even if the reactant gas is supplied with the purge gas, an unnecessary thin film is not deposited, and the source gas and the reactant gas that are supplied for seventh time t7 in which plasma is supplied are activated and thus, a thin film is deposited.

That is, for fifth time t5, the source gas that is supplied to the reaction space is adsorbed on a substrate, and the reactant gas that is supplied to the reaction space is reactivated by second plasma that is supplied for seventh time t7 to react with a source gas that is adsorbed on the substrate, thereby forming a thin film. In this case, a process of supplying second plasma is an in situ plasma process or a direct plasma process.

After the first gas supply cycle (Step A) is initially repeated about ten times, the second gas supply cycle (Step B) is repeated a plurality of times such that a thin film of a desired thickness is deposited.

Here, a silicon source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, Si $H_2[N(Et)(Me)]_2$; AHEAD, $Si_2$ $(NHEt)_6$; TEAS, $Si(NHEt)_4$; and $Si_3H_8$. A gas containing oxygen, which is a reactant gas, may include at least one of $O_2$, $O_3$, $NO_2$, and $CO_2$.

In the foregoing exemplary embodiment, from first time t1 to fourth time t4 and from fifth time t5 to eighth time t8, an inert purge gas is continuously supplied, but in accordance with a method of depositing a thin film according to another exemplary embodiment of the present invention, a reactant gas is activated only for third time t3 and seventh time t7 in which plasma is supplied without supply of an additional inert purge gas and the reactant gas is not activated for other time cycles to perform a function of a purge gas.

In this way, in accordance with a method of depositing a thin film according to an exemplary embodiment of the present invention, at initial thin film deposition step, after a thin film is deposited using a remote plasma process, a thin film is deposited using a direct plasma process such as an in situ plasma process. Because motility of oxygen radical occurring by remote plasma is lower than motility of oxygen radical occurring by in situ plasma, at initial thin film deposition step, relatively less sub-layer oxidation occurs. Therefore, deterioration of device characteristics according to sub-layer oxidation can be minimized.

Further, at the initial step, after a remote plasma process is used, by depositing a thin film using an in situ plasma process, a thin film of a desired thickness can be deposited at a fast speed.

Figure 3:
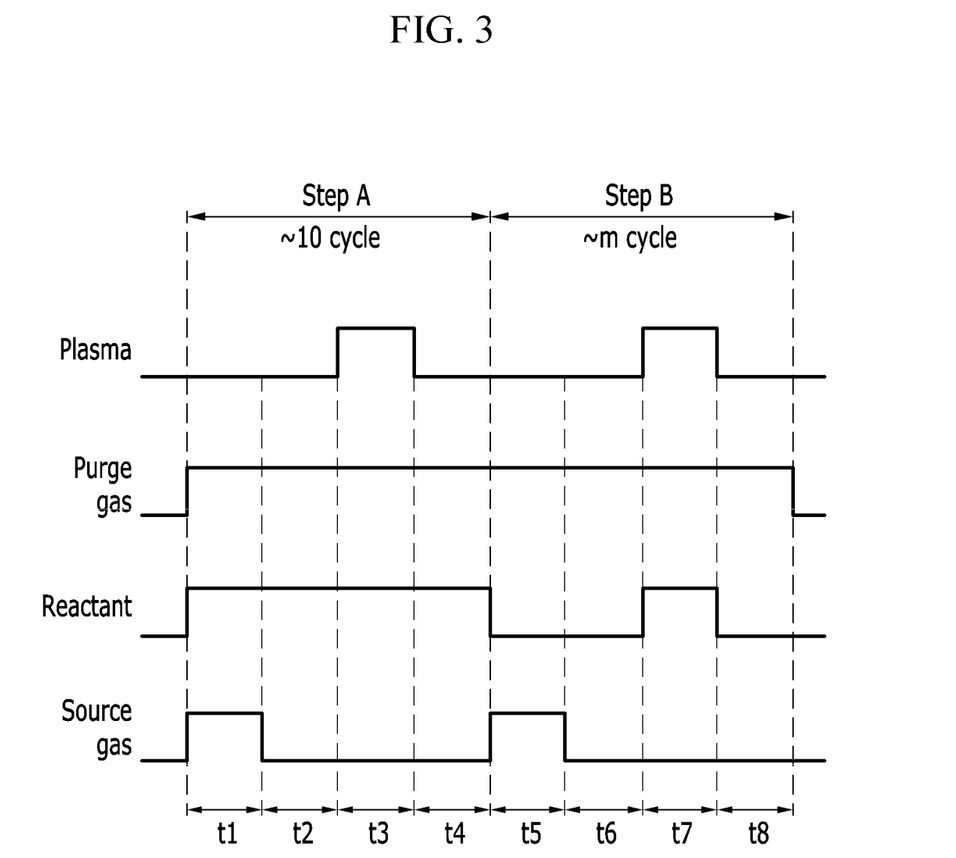
FIG. 3 is a diagram illustrating a gas supply cycle of a method of depositing a thin film according to yet another exemplary embodiment of the present invention.

Hereinafter, a method of depositing a thin film according to yet another exemplary embodiment of the present invention will be described with reference to FIG. 3. FIG. 3 is a diagram illustrating a gas supply cycle of a method of depositing a thin film according to yet another exemplary embodiment of the present invention.

Referring to FIG. 3, a method of depositing a thin film includes a first gas supply cycle (Step A) and a second gas supply cycle (Step B). In the first gas supply cycle (Step A), from first time t1 to fourth time t4, while a purge gas and a reactant gas are supplied, a source gas is supplied for first time t1, and first plasma is supplied for third time t3. When the source gas and the reactant gas have weak reactivity in non-activation state, even if the reactant gas is supplied with the purge gas, an unnecessary thin film is not deposited, and the source gas and the reactant gas that are supplied for third time t3 in which plasma is supplied are activated and thus, a thin film is deposited.

That is, for first time t1, the source gas that is supplied to the reaction space is adsorbed on a substrate, and the reactant gas that is supplied to the reaction space is activated by first plasma that is supplied for third time t3 to react with the source gas that is adsorbed on the substrate, thereby forming a thin film. In this case, a process of supplying first plasma is a remote plasma process.

In the second gas supply cycle (Step B), from fifth time t5 to eighth time t8, while a purge gas is supplied, a source gas is supplied for fifth time t5, and while a reactant gas is supplied for seventh time t7, second plasma is supplied.

The source gas that is supplied to the reaction space for fifth time t5 is adsorbed on a substrate, and the reactant gas that is supplied to the reaction space for seventh time t7 is activated by second plasma to react with the source gas that is adsorbed on the substrate, thereby forming a thin film. In this case, a process of supplying second plasma is an in situ plasma process or a direct plasma process.

After the first gas supply cycle (Step A) is initially repeated about ten times, the second gas supply cycle (Step B) is repeated a plurality of times such that a thin film of a desired thickness is deposited.

Here, a silicon source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2$ $(NHEt)_6$; TEAS, $Si(NHEt)_4$; and $Si_3H_8$. A gas containing oxygen, which is a reactant gas, may include at least one of $O_2$, $O_3$, $NO_2$, and $CO_2$.

In the foregoing exemplary embodiment, from first time t1 to fourth time t4 and from fifth time t5 to eighth time t8, an inert purge gas is continuously supplied, but in accordance with a method of depositing a thin film according to yet another exemplary embodiment of the present invention, a reactant gas is activated only for third time t3 and seventh time t7 in which plasma is supplied without supply of an additional inert purge gas and the reactant gas is not activated for other time cycles to perform a function of a purge gas.

In this way, in accordance with a method of depositing a thin film according to an exemplary embodiment of the present invention, at initial thin film deposition step, after a thin film is deposited using a remote plasma process, a thin film is deposited using a direct plasma process such as an in situ plasma process. Because motility of oxygen radical occurring by remote plasma is lower than that of oxygen radical occurring by in situ plasma, at the initial thin film deposition step, relatively less sub-layer oxidation occurs. Therefore, deterioration of device characteristics according to sub-layer oxidation can be minimized.

Further, at the initial step, after a remote plasma process is used, by depositing a thin film using an in situ plasma process, a thin film of a desired thickness can be deposited at a fast speed.

Figure 4:
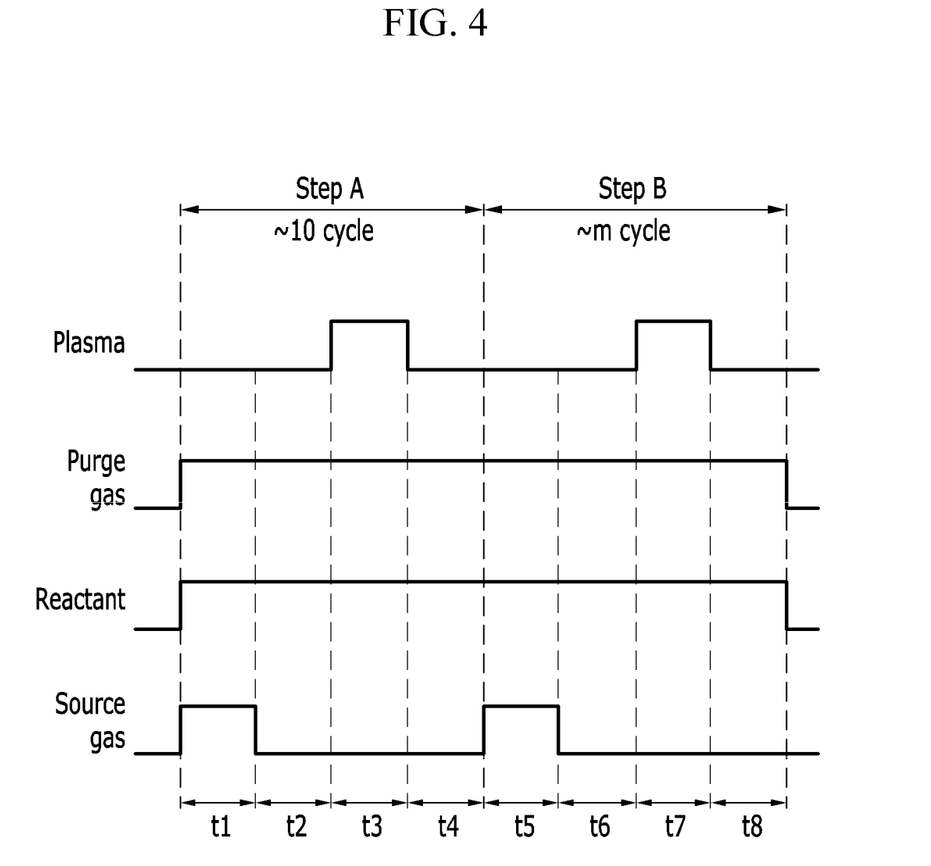
FIG. 4 is a diagram illustrating a gas supply cycle of a method of depositing a thin film according to yet another exemplary embodiment of the present invention.

Hereinafter, a method of depositing a thin film according to yet another exemplary embodiment of the present invention will be described with reference to FIG. 4. FIG. 4 is a diagram illustrating a gas supply cycle of a method of depositing a thin film according to an exemplary embodiment of the present invention.

Referring to FIG. 4, a method of depositing a thin film according to the present exemplary embodiment includes a first gas supply cycle (Step A) and a second gas supply cycle (Step B). In the first gas supply cycle (Step A), from first time t1 to fourth time t4, while a purge gas and a reactant gas are supplied, a source gas is supplied for first time t1, and first plasma is supplied for third time t3. When the source gas and the reactant gas have weak reactivity in non-activation state, even if the reactant gas is supplied with the purge gas, an unnecessary thin film is not deposited, and the source gas and the reactant gas that are supplied for third time t3 in which plasma is supplied are activated and thus, a thin film is deposited.

That is, the source gas that is supplied to the reaction space for first time t1 is adsorbed on a substrate, and the reactant gas that is supplied to the reaction space is activated by first plasma that is supplied for third time t3 to react with a source gas that is adsorbed on the substrate, thereby forming a thin film. In this case, a process of supplying first plasma is a remote plasma process.

In the second gas supply cycle (Step B), from fifth time t5 to eighth time t8, while a purge gas and a reactant gas are supplied, a source gas is supplied for fifth time t5, and for seventh time t7, second plasma is supplied. When the source gas and the reactant gas have weak reactivity in a deactivation state, even if the reactant gas is supplied with the purge gas, an unnecessary thin film is not deposited, and the source gas and the reactant gas supplied for seventh time t7 in which plasma is supplied are activated and thus, a thin film is deposited.

That is, for fifth time t5, the source gas that is supplied to the reaction space is adsorbed on a substrate, and the reactant gas that is supplied to the reaction space is reactivated by second plasma that is supplied for seventh time t7 to react with the source gas that is adsorbed on the substrate, thereby forming a thin film. In this case, a process of supplying second plasma is an in situ plasma process or a direct plasma process.

After the first gas supply cycle (Step A) is initially repeated about ten times, the second gas supply cycle (Step B) is repeated a plurality of times such that a thin film of a desired thickness is deposited.

Here, a silicon source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$. A gas containing oxygen, which is a reactant gas, may include at least one of $O_2$, $O_3$, $NO_2$, and $CO_2$.

In the foregoing exemplary embodiment, from first time t1 to fourth time t4 and from fifth time t5 to eighth time t8, an inert purge gas is continuously supplied, but in accordance with a method of depositing a thin film according to yet another exemplary embodiment of the present invention, a reactant gas is activated and operates only for third time t3 and seventh time t7 in which plasma is supplied without supply of an additional inert purge gas and the reactant gas is not activated for other time cycles to perform a function of a purge gas.

In this way, in accordance with a method of depositing a thin film according to an exemplary embodiment of the present invention, at initial thin film deposition step, after a thin film is deposited using a remote plasma process, a thin film is deposited using a direct plasma process such as an in situ plasma process. Because motility of oxygen radical occurring by remote plasma is lower than that of oxygen radical occurring by in situ plasma, at initial thin film deposition step, relatively less sub-layer oxidation occurs. Therefore, deterioration of device characteristics according to sub-layer oxidation can be minimized.

Further, at the initial step, after a remote plasma process is used, by depositing a thin film using an in situ plasma process, a thin film of a desired thickness can be deposited at a fast speed.

Figure 5:
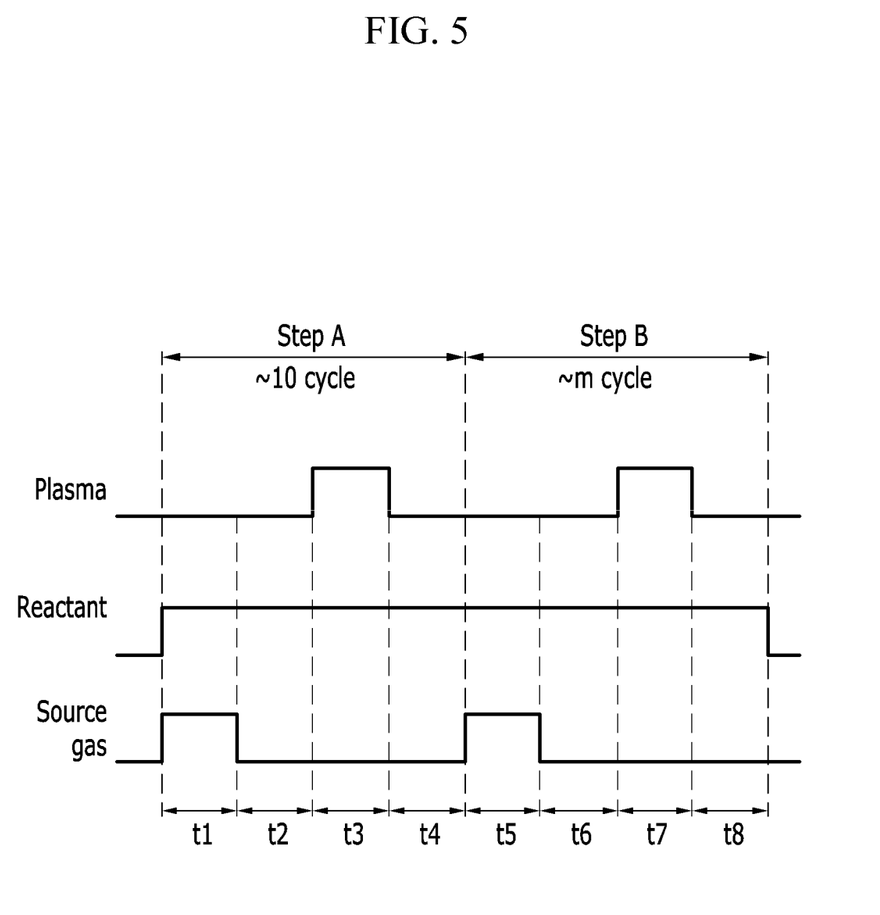
FIG. 5 is a diagram illustrating a gas supply cycle of a method of depositing a thin film according to yet another exemplary embodiment of the present invention.

Hereinafter, a method of depositing a thin film according to yet another exemplary embodiment of the present invention will be described with reference to FIG. 5. FIG. 5 is a diagram illustrating a gas supply cycle of a method of depositing a thin film according to yet another exemplary embodiment of the present invention.

Referring to FIG. 5, a method of depositing a thin film includes a first gas supply cycle (Step A) and a second gas supply cycle (Step B). In the first gas supply cycle (Step A), from first time t1 to fourth time t4, while a reactant gas is supplied, a source gas is supplied for first time t1, and first plasma is supplied for third time t3. The reactant gas has weak reactivity in a non-activation state. Therefore, for first time t1 to fourth time t4, even if a reactant gas is supplied, an unnecessary thin film is not deposited, and a source gas and a reactant gas that are supplied for third time t3 in which plasma is supplied are activated and thus, a thin film is deposited.

That is, for first time t1, the source gas that is supplied to the reaction space is adsorbed on a substrate, and the reactant gas that is supplied to the reaction space is activated by first plasma that is supplied for third time t3 to react with the source gas that is adsorbed on the substrate, thereby forming a thin film. In this case, a process of supplying first plasma is a remote plasma process.

In the second gas supply cycle (Step B), from fifth time t5 to eighth time t8, while a reactant gas is supplied, a source gas is supplied for fifth time t5, and second plasma is supplied for seventh time t7. The reactant gas has weak reactivity in a non-activation state. Therefore, from fifth time t5 to eighth time t8, even if a reactant gas is supplied, an unnecessary thin film is not deposited, and a source gas and a reactant gas that are supplied for seventh time t7 in which plasma is supplied are activated and thus, a thin film is deposited.

That is, for fifth time t5, the source gas that is supplied to the reaction space is adsorbed on a substrate, and the reactant gas that is supplied to the reaction space is reactivated by second plasma that is supplied for seventh time t7 to react with a source gas that is adsorbed on the substrate, thereby forming a thin film. In this case, a process of supplying second plasma is an in situ plasma process or a direct plasma process.

After the first gas supply cycle (Step A) is initially repeated about ten times, the second gas supply cycle (Step B) is repeated a plurality of times such that a thin film of a desired thickness is deposited.

Here, a silicon source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$. A gas containing oxygen, which is a reactant gas, may include at least one of $O_2$, $O_3$, $NO_2$, and $CO_2$.

In the foregoing exemplary embodiment, from first time t1 to fourth time t4 and from fifth time t5 to eighth time t8, a reactant gas was supplied without an inert purge gas. As described above, because the reactant gas has weak reactivity in a non-activation state, the reactant gas is activated and operates only for third time t3 and seventh time t7 in which plasma is supplied and the reactant gas is not activated for other time cycles to perform a function of a purge gas.

In this way, in accordance with a method of depositing a thin film according to an exemplary embodiment of the present invention, at initial thin film deposition step, after a thin film is deposited using a remote plasma process, a thin film is deposited using a direct plasma process such as an in situ plasma process. Because motility of oxygen radical occurring by remote plasma is lower than that of oxygen radical occurring by in situ plasma, at initial thin film deposition step, relatively less sub-layer oxidation occurs. Therefore, deterioration of device characteristics according to sub-layer oxidation can be minimized.

Further, at the initial step, after a remote plasma process is used, by depositing a thin film using an in situ plasma process, a thin film of a desired thickness can be deposited at a fast speed.

Figure 6:
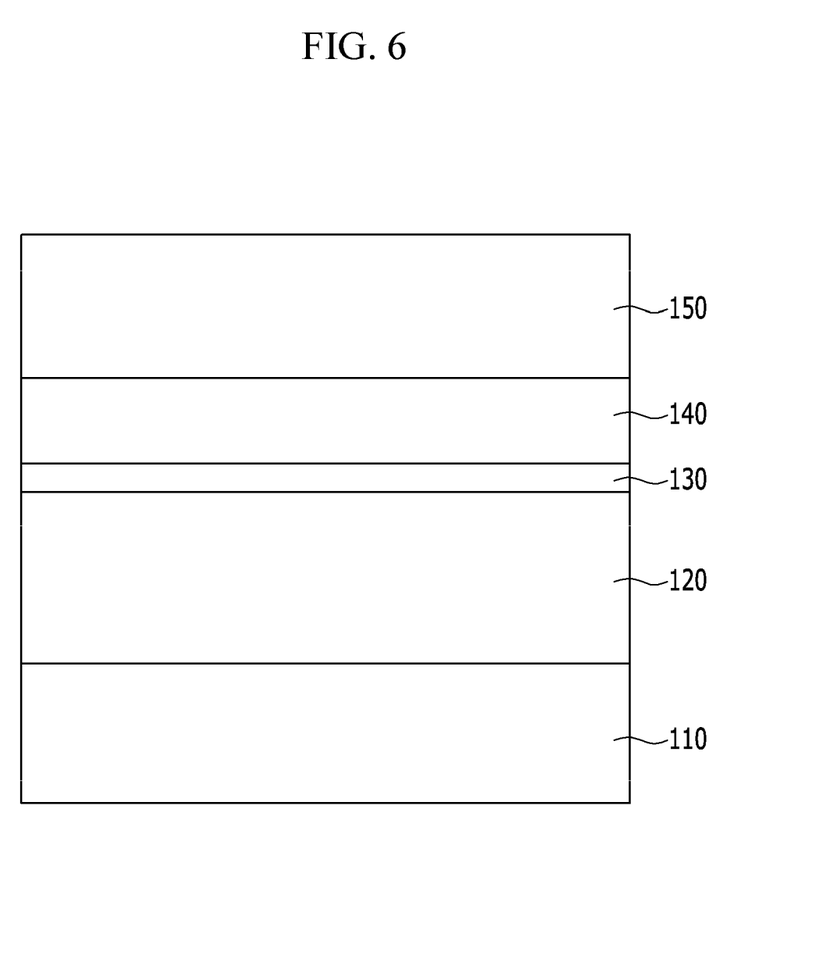
FIG. 6 is a diagram illustrating a thin film layer that is deposited by a method of depositing a thin film according to an exemplary embodiment of the present invention.
Figure 7:
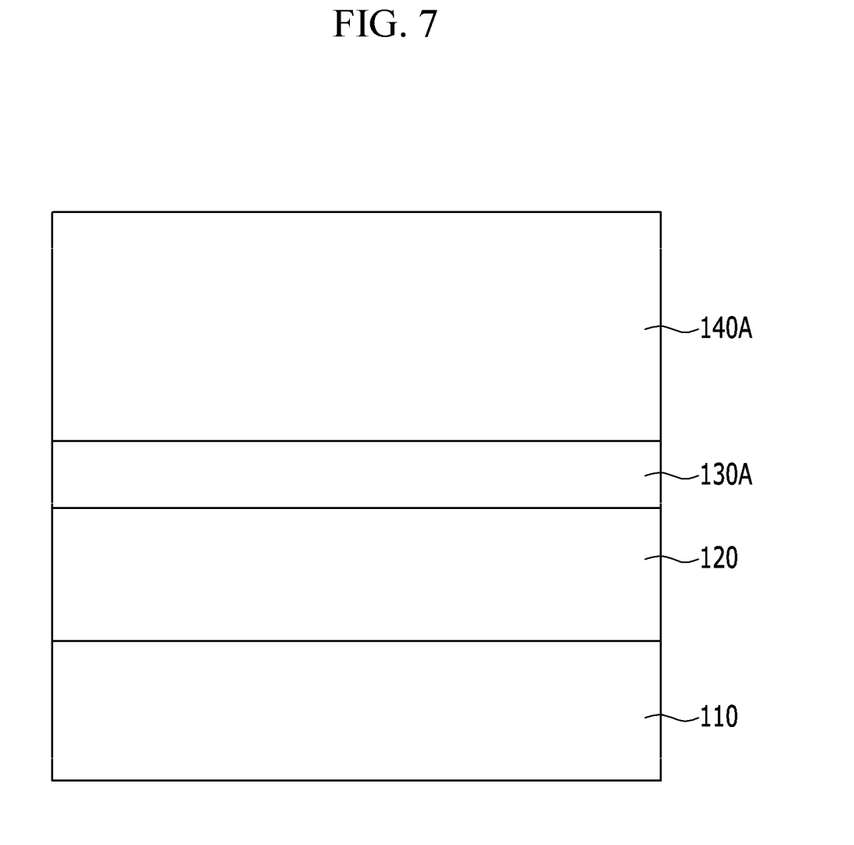
FIG. 7 is a diagram illustrating a thin film layer that is deposited by a conventional method of depositing a thin film.

Hereinafter, a thin film layer that is deposited by a method of depositing a thin film according to an exemplary embodiment of the present invention will be described with reference to FIGS. 6 and 7. FIG. 6 is a diagram illustrating a thin film layer that is deposited by a method of depositing a thin film according to an exemplary embodiment of the present invention, and FIG. 7 is a diagram illustrating a thin film layer that is deposited by a conventional method of depositing a thin film.

Referring to FIG. 6, in a thin film layer that is deposited by a method of depositing a thin film according to an exemplary embodiment of the present invention, a sub layer 120 is formed on a substrate 110 in which a thin film is deposited, a first oxidized layer 130 having a relatively small first thickness D1 is formed on the sub layer 120, and a first layer 140 and a second layer 150 are formed on the first oxidized layer 130. The sub layer 120 may be omitted.

The first oxidized layer 130 and the first layer 140 are formed by initially repeating a first gas supply cycle (Step A) about ten times and are deposited using a remote plasma process, and the second layer 150 is formed by repeating a second gas supply cycle (Step B) and is deposited using a direct plasma process such as an in situ plasma process.

In accordance with a method of depositing a thin film according to an exemplary embodiment of the present invention, because a first gas supply cycle (Step A) using a remote plasma process is initially repeated about ten times and remote plasma is used in an initial deposition process, relatively less sub-layer oxidation occurs due to weak motility of oxygen radical. Therefore, a first thickness D1 of the first oxidized layer 130 is relatively small.

Referring to FIG. 7, as in the conventional method of depositing a thin film, in a thin film layer in which a thin film is deposited using an in situ plasma process, a sub layer 120 is formed on a substrate 110 in which a thin film is deposited, a second oxidized layer 130A having a relatively large second thickness D2 is formed on the sub layer 120, and a third layer 140A is formed on the second oxidized layer 130A. The sub layer 120 may be omitted.

As described above, because in situ plasma generates directly on the substrate 110, motility of oxygen radical is very large and thus, in a lower portion of the deposited third layer 140A, a second oxidized layer 130A having the relatively large second thickness D2 is formed.

Figure 8:
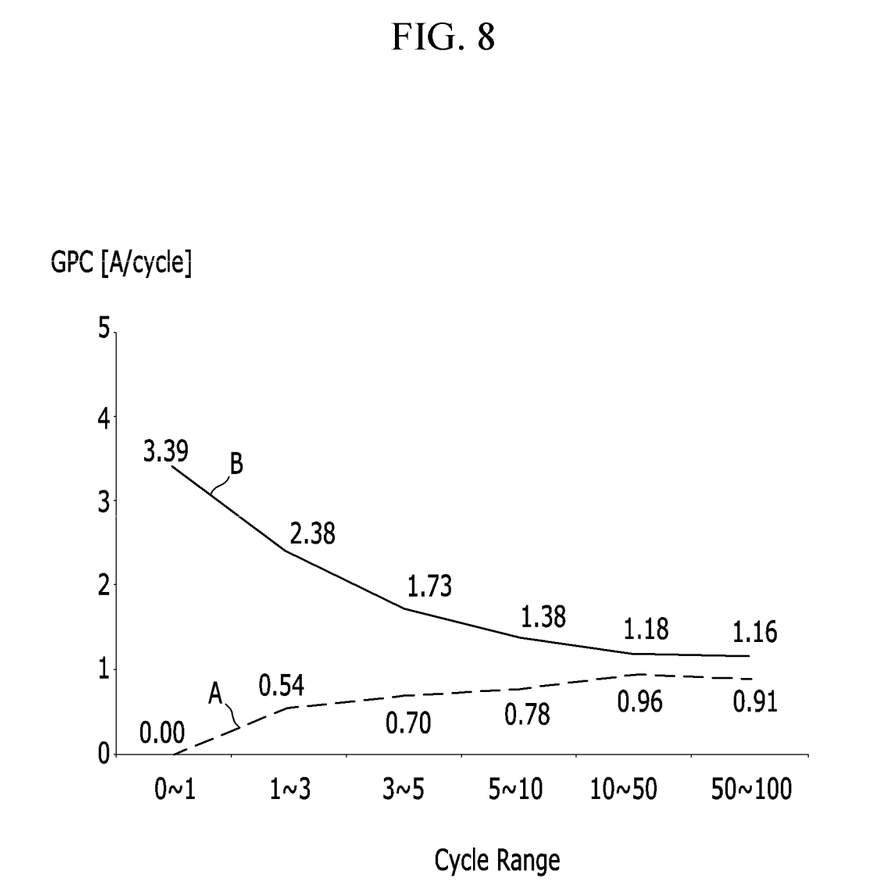
FIG. 8 is a graph illustrating a result of an Experimental Example of the present invention.

Hereinafter, an Experimental Example of the present invention will be described with reference to FIG. 8. FIG. 8 is a graph illustrating a result of the Experimental Example of the present invention.

In the present Experimental Example, in a case of depositing a silicon oxide layer $SiO_2$ by atomic layer deposition or ALD using direct plasma such as in situ plasma and a case of depositing a silicon oxide layer $SiO_2$ by a deposition method ALD using remote plasma, a deposition rate of a silicon oxide layer according to the gas supply cycle number is measured and a result thereof is shown in FIG. 8.

In the present Experimental Example, all conditions, except for a plasma supply method, were the same and a substrate temperature was about 300° C.

Here, a silicon source gas may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$. A gas containing oxygen, which is a reactant gas, may include at least one of $O_2$, $O_3$, $NO_2$, and $CO_2$.

Referring to FIG. 8, a first graph A illustrates a result of a method of depositing a film by remote plasma atomic layer deposition, and a second graph B illustrates a result of a method of depositing an in situ plasma atomic layer deposition.

Referring to the first graph A, in a deposition method using remote plasma, a deposition rate of a thin film gradually increases according to a gas supply cycle up to a gas supply cycle of about first ten cycles and then becomes almost constant. Referring to the second graph B, in a deposition method using in situ plasma, it can be seen that a deposition rate is very large up to a gas supply cycle of about first ten cycles and then becomes almost constant.

Sub-layer oxidation generally occurs in an initial process of forming a thin film. This is because as a gas supply cycle is repeated, a thickness of a formed film gradually increases, and as a film thickness increases, oxygen radical occurring when plasma is supplied is blocked and thus, oxygen radical cannot be injected into a lower portion of the film.

In a deposition method using an in situ plasma process, a film that is deposited at an initial stage of a thin film deposition process has a relatively large thickness, and this is because a sub layer is also oxidized due to strong oxidizing power of in situ plasma. However, in a deposition method using a remote plasma process, a thickness of a film that is deposited at an initial stage of a deposition process is relatively small and this is because remote plasma does not oxidize a sub-layer due to relatively weak oxidation power, compared with in situ plasma. In this way, as in a method of depositing a thin film according to an exemplary embodiment of the present invention, after a remote plasma process is used in a gas supply cycle of an initial stage of depositing a thin film, when a thin film is deposited using an in situ plasma process, a sub oxide layer that may occur at an initial stage of a deposition process is reduced, and thus, device characteristics can be prevented from deteriorating according to the sub oxide layer.

Figure 9:
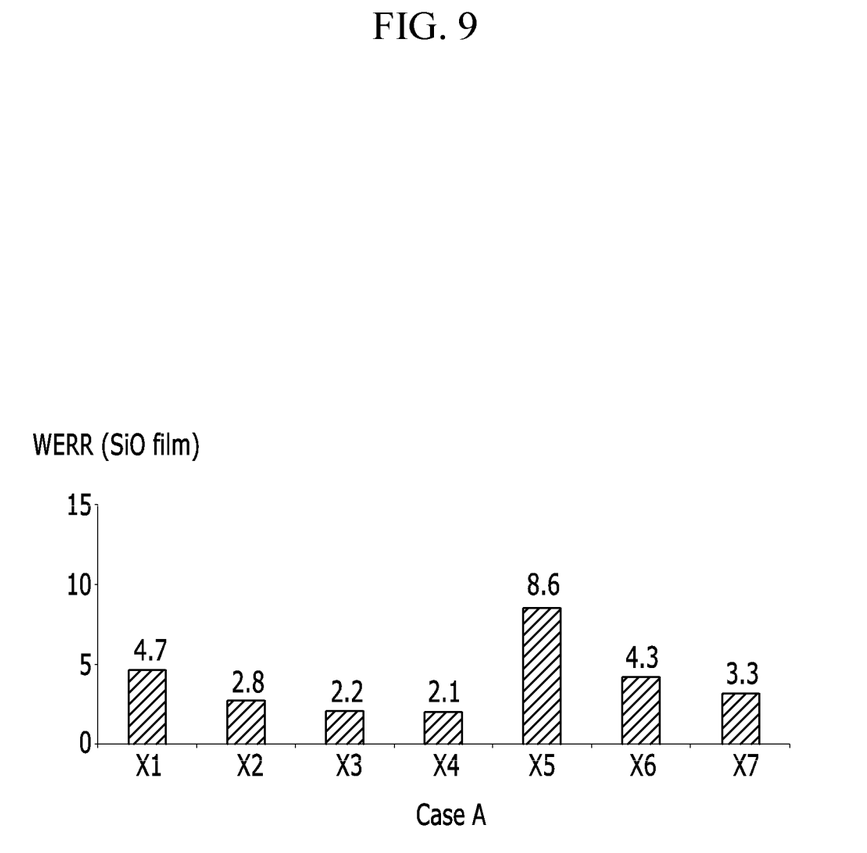
FIGS. 9 and 10 are graphs illustrating results of another Experimental Example of the present invention.
Figure 10:
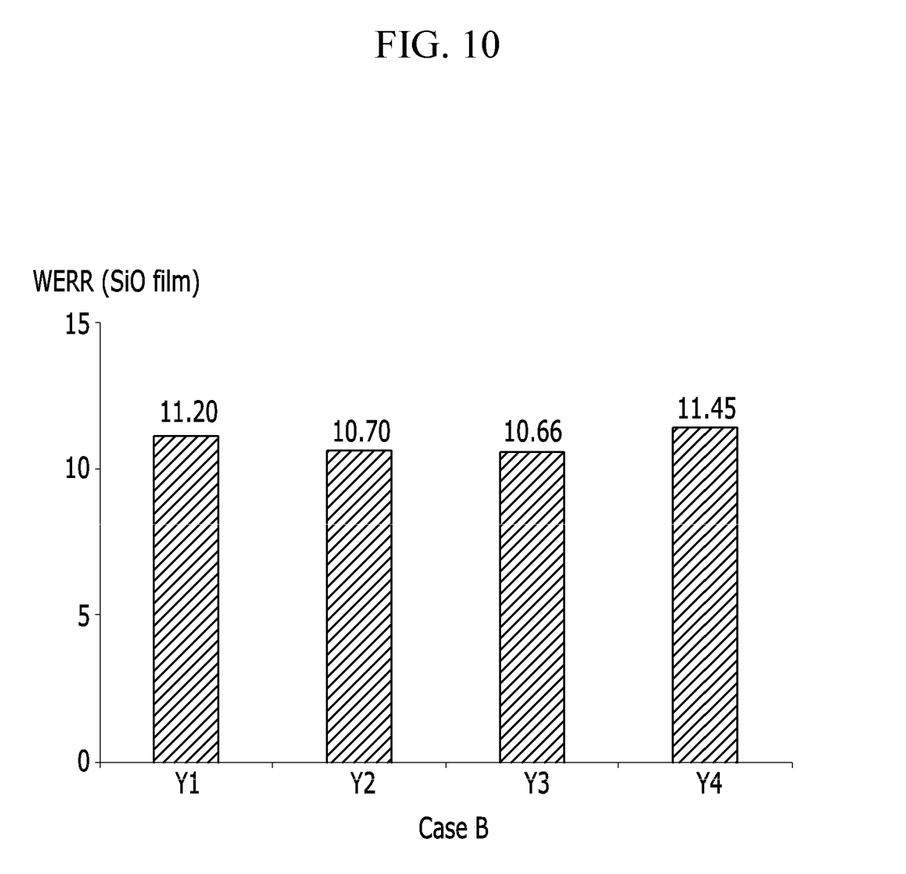

Hereinafter, a result of another Experimental Example of the present invention will be described with reference to FIGS. 9 and 10. FIGS. 9 and 10 are graphs illustrating a result of another Experimental Example of the present invention.

In the present Experimental Example, for a first case (case A) of forming a silicon oxide layer $SiO_2$ through an in situ plasma atomic layer deposition process while changing a magnitude of plasma power and a second case (case B) of forming a silicon oxide layer SiO₂ through a remote plasma atomic layer deposition process while changing a magnitude of plasma power, a Wet Etch Rate Ratios (WERR) were measured. Here, the WERR is a ratio of an etch rate of a silicon oxide layer $SiO_2$ that is deposited through a plasma atomic layer deposition process to an etch rate of a thermal silicon oxide layer SiO2 that is deposited through a thermal process in the same etchant. In this case, in the first case (case A), other conditions were the same, except for a magnitude and a supply time of plasma power, and in the second case (case B), other conditions were the same, except for a magnitude and a supply time of plasma power. FIG. 9 represents a result of the first case (case A), and FIG. 10 represents a result of the second case (case B).

In the first case (case A) using an in situ plasma process, in several cases X1, X2, X3, X4, X5, X6, and X7 in which magnitudes of plasma power are different, each WERR was measured. In case X1, plasma power of 400 W was supplied for about 1 second, in case X2, plasma power of 600 W was supplied for about 1 second, in case X3, plasma power of 800 W was supplied for about 1 second, in case X4, plasma power of 1000 W was supplied for about 1 second, in case X5, plasma power of 400 W was supplied for about 0.3 second, in case X6, plasma power of 800 W was supplied for about 0.3 second, and in case X7, plasma power of 1000 W was supplied for about 0.3 second.

In the second case (case B) using a remote plasma process, in several cases Y1, Y2, Y3, and Y4 in which magnitudes of plasma power are different, each WERR was measured. In case Y1, remote plasma power of about 1 kW was supplied for about 1 second, in case Y2, remote plasma power of about 2 kW was supplied for about 1 second, in case Y3, remote plasma power of about 1 kW was supplied for about 3 second, and in case Y4, remote plasma power of about 1 kW was supplied for about 0.3 second.

Referring to FIG. 9, it can be seen that in the first case (case A) using an in situ plasma process, wet etch rates vary according to several cases X1, X2, X3, X4, X5, X6, and X7 in which a plasma power supply time and a magnitude are different. That is, when using an in situ plasma process, it can be seen that a characteristic of a thin film that is formed may be largely changed according to plasma power.

Referring to FIG. 10, it can be seen that in the second case (case B) using a remote plasma process, a change of a wet etch rate is not largely according to several cases Y1, Y2, Y3, and Y4 in which magnitudes of plasma power are different. That is, when using a remote plasma process, it can be seen that a characteristic of a thin film that is formed is not largely changed according to plasma power and an applied time, and thus, a thin film may be formed stably.

In this way, as in a method of depositing a thin film according to an exemplary embodiment of the present invention, by using a remote plasma process for an initial gas supply cycle, an initial film is formed stably. And by using an in situ plasma process after an initial gas supply cycle, not only sub-layer oxidation is prevented, but also a thin film having various characteristics can be deposited by changing a process condition.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of depositing a thin film, the method comprising:
    supplying a source gas to a reaction space;
    repeating a first gas supply cycle a first plurality of times, the first gas supply cycle comprising supplying first plasma while supplying a reactant gas to the reaction space;
    supplying the source gas to the reaction space; and
    repeating a second gas supply cycle a second plurality of times, the second gas supply cycle comprising supplying second plasma while supplying the reactant gas to the reaction space,
    wherein the supplying of the first plasma is executed by supplying remote plasma, and the supplying of the second plasma is executed by supplying direct plasma, and
    wherein the first gas supply cycle is firstly repeated the first plurality of times at initial step of depositing the thin film to reduce sub-layer oxidation, and then the second gas supply cycle is repeated the second plurality of times;
    wherein the repeating of a first plurality of times comprises repeating the first gas supply cycle up to seven times.

2. The method of claim 1, wherein the first gas supply cycle comprises:
    supplying the source gas together with a purge gas to the reaction space for a first time;
    supplying the purge gas to the reaction space for a second time; and
    supplying the first plasma while supplying the reactant gas together with the purge gas to the reaction space for a third time.

3. The method of claim 2, wherein the first gas supply cycle further comprises supplying the purge gas to the reaction space for a fourth time.

4. The method of claim 1, wherein the first gas supply cycle comprises:
    supplying the reactant gas together with a purge gas to the reaction space for a first time, a second time, a third time, and a fourth time;
    supplying the source gas for the first time; and
    supplying the first plasma for the third time.

5. The method of claim 1, wherein the first gas supply cycle comprises:
    supplying the reactant gas to the reaction space for a first time, a second time, a third time, and a fourth time;
    supplying the source gas for the first time; and
    supplying the first plasma for the third time,
    wherein the reactant gas has lower reactivity in a non-activation state.

6. The method of claim 1, wherein the second gas supply cycle comprises:
    supplying the source gas together with a purge gas to the reaction space for a fifth time;
    supplying the purge gas to the reaction space for a sixth time; and
    supplying the second plasma while supplying the reactant gas together with the purge gas to the reaction space for a seventh time.

7. The method of claim 6, wherein the second gas supply cycle further comprises supplying the purge gas to the reaction space for an eighth time.

8. The method of claim 1, wherein the second gas supply cycle comprises:

supplying the reactant gas together with a purge gas to the reaction space for a fifth time, a sixth time, a seventh time, and an eighth time;
supplying the source gas for the fifth time; and
supplying the second plasma for the seventh time.

9. The method of claim 1, wherein the second gas supply cycle comprises:
supplying the reactant gas to the reaction space for a fifth time, a sixth time, a seventh time, and an eighth time;
supplying the source gas for the fifth time; and
supplying the second plasma for the seventh time,
wherein the reactant gas has lower reactivity in a non-activation state.

10. The method of claim 1, wherein the source gas comprises silicon, and the reactant gas comprises an oxygen gas.

11. The method of claim 10, wherein the source gas comprises at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$.

12. The method of claim 10, wherein the reactant gas comprises at least one of $O_2$, $O_3$, $NO_2$, and $CO_2$.

13. The method of claim 1, wherein the source gas comprises silicon, and the reactant gas comprises an oxygen gas.

14. The method of claim 13, wherein the source gas comprises at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DIPAS, $SiH_3N(iPr)_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; TEOS, $Si(OEt)_4$; $SiCl_4$; HCD, $Si_2Cl_6$; DCS, $SiH_2Cl_2$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; and $Si_3H_8$.

15. The method of claim 13, wherein the reactant gas comprises at least one of $O_2$, $O_3$, $NO_2$, and $CO_2$.

* * * * *